United States Patent
Lin et al.

(10) Patent No.: US 9,472,452 B2
(45) Date of Patent: *Oct. 18, 2016

(54) SEMICONDUCTOR DEVICE AND METHOD OF FORMING REPASSIVATION LAYER WITH REDUCED OPENING TO CONTACT PAD OF SEMICONDUCTOR DIE

(71) Applicant: STATS ChipPAC, Ltd., Singapore (SG)

(72) Inventors: Yaojian Lin, Singapore (SG); Kang Chen, Singapore (SG); Jianmin Fang, Singapore (SG); Xia Feng, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/284,752

(22) Filed: May 22, 2014

(65) Prior Publication Data

US 2014/0252654 A1 Sep. 11, 2014

Related U.S. Application Data

(60) Continuation of application No. 13/664,626, filed on Oct. 31, 2012, now Pat. No. 8,786,100, which is a division of application No. 12/724,367, filed on Mar. 15, 2010, now Pat. No. 8,343,809.

(51) Int. Cl.
*H01L 21/768* (2006.01)
*H01L 21/56* (2006.01)
(Continued)

(52) U.S. Cl.
CPC ....... *H01L 21/76879* (2013.01); *H01L 21/563* (2013.01); *H01L 23/3114* (2013.01);
(Continued)

(58) Field of Classification Search
CPC ............... H01L 21/76802; H01L 23/5384; H01L 21/76879; H01L 23/5226
USPC .......................................................... 257/774
See application file for complete search history.

(56) References Cited

U.S. PATENT DOCUMENTS 4,894,115 A 1/1990 Eichelberger et al.
5,157,001 A 10/1992 Sakuma
(Continued)

FOREIGN PATENT DOCUMENTS

CN 1246731 A 3/2000
CN 101138084 A 3/2008
(Continued)

*Primary Examiner* — Roy Potter
(74) *Attorney, Agent, or Firm* — Robert D. Atkins; Patent Law Group: Atkins and Associates, P.C.

(57) ABSTRACT

A semiconductor wafer has a plurality of first semiconductor die. A first conductive layer is formed over an active surface of the die. A first insulating layer is formed over the active surface and first conductive layer. A repassivation layer is formed over the first insulating layer and first conductive layer. A via is formed through the repassivation layer to the first conductive layer. The semiconductor wafer is singulated to separate the semiconductor die. The semiconductor die is mounted to a temporary carrier. An encapsulant is deposited over the semiconductor die and carrier. The carrier is removed. A second insulating layer is formed over the repassivation layer and encapsulant. A second conductive layer is formed over the repassivation layer and first conductive layer. A third insulating layer is formed over the second conductive layer and second insulating layer. An interconnect structure is formed over the second conductive layer.

25 Claims, 8 Drawing Sheets

(51) Int. Cl.
*H01L 23/31* (2006.01)
*H01L 23/498* (2006.01)
*H01L 23/538* (2006.01)
*H01L 23/00* (2006.01)
*H01L 23/522* (2006.01)

(52) U.S. Cl.
CPC ..... *H01L23/49816* (2013.01); *H01L 23/5226* (2013.01); *H01L 23/5389* (2013.01); *H01L 24/18* (2013.01); *H01L 24/19* (2013.01); *H01L 24/82* (2013.01); *H01L 24/96* (2013.01); H01L 21/568 (2013.01); H01L 2223/5448 (2013.01); H01L 2224/04105 (2013.01); H01L 2224/12105 (2013.01); H01L 2224/18 (2013.01); H01L 2224/48091 (2013.01); H01L 2224/73265 (2013.01); H01L 2924/01004 (2013.01); H01L 2924/014 (2013.01); H01L 2924/01005 (2013.01); H01L 2924/01006 (2013.01); H01L 2924/01013 (2013.01); H01L 2924/01029 (2013.01); H01L 2924/01032 (2013.01); H01L 2924/01033 (2013.01); H01L 2924/01047 (2013.01); H01L 2924/01049 (2013.01); H01L 2924/01073 (2013.01); H01L 2924/01075 (2013.01); H01L 2924/01078 (2013.01); H01L 2924/01079 (2013.01); H01L 2924/01082 (2013.01); H01L 2924/01322 (2013.01); H01L 2924/09701 (2013.01); H01L 2924/10329 (2013.01); H01L 2924/12041 (2013.01); H01L 2924/12042 (2013.01); H01L 2924/1306 (2013.01); H01L 2924/13091 (2013.01); H01L 2924/14 (2013.01); H01L 2924/15311 (2013.01); H01L 2924/181 (2013.01)

(56) References Cited

U.S. PATENT DOCUMENTS

| | | | |
|---|---|---|---|
| 5,161,093 A | 11/1992 | Gorczyca et al. | |
| 5,250,843 A | 10/1993 | Eichelberger | |
| 5,353,498 A | 10/1994 | Fillion et al. | |
| 5,527,741 A | 6/1996 | Cole et al. | |
| 5,614,765 A * | 3/1997 | Avanzino et al. | 257/774 |
| 5,703,400 A | 12/1997 | Wojnarowski et al. | |
| 5,814,193 A | 9/1998 | Crowe | |
| 5,834,340 A | 11/1998 | Sawai et al. | |
| 5,841,193 A | 11/1998 | Eichelberger | |
| 5,866,952 A | 2/1999 | Wojnarowski et al. | |
| 6,025,995 A | 2/2000 | Marcinkiewicz | |
| 6,028,364 A | 2/2000 | Ogino et al. | |
| 6,110,773 A | 8/2000 | Lee | |
| 6,168,966 B1 | 1/2001 | Fan et al. | |
| 6,187,615 B1 | 2/2001 | Kim et al. | |
| 6,197,613 B1 | 3/2001 | Kung et al. | |
| 6,271,469 B1 | 8/2001 | Ma et al. | |
| 6,274,486 B1 * | 8/2001 | Rhodes et al. | 438/653 |
| 6,423,571 B2 | 7/2002 | Ogino et al. | |
| 7,008,822 B2 | 3/2006 | Bolken et al. | |
| 7,165,316 B2 | 1/2007 | Fjelstad | |
| 7,189,596 B1 | 3/2007 | Mu et al. | |
| 7,192,807 B1 | 3/2007 | Huemoeller et al. | |
| 7,348,277 B2 * | 3/2008 | Koo et al. | 438/692 |
| 7,569,427 B2 | 8/2009 | Theuss | |
| 7,598,117 B2 | 10/2009 | Kurita et al. | |
| 7,619,901 B2 | 11/2009 | Eichelberger et al. | |
| 7,642,128 B1 | 1/2010 | Lin et al. | |
| 7,657,157 B2 | 2/2010 | Okabayashi et al. | |
| 7,666,709 B1 | 2/2010 | Lin et al. | |
| 7,675,157 B2 | 3/2010 | Liu et al. | |
| 7,767,496 B2 | 8/2010 | Shim et al. | |
| 7,888,238 B2 | 2/2011 | Wakisaka et al. | |
| 7,915,690 B2 | 3/2011 | Shen | |
| 8,012,807 B2 | 9/2011 | Meyer et al. | |
| 8,035,231 B2 | 10/2011 | Kurita et al. | |
| 8,039,303 B2 | 10/2011 | Shim et al. | |
| 8,097,489 B2 | 1/2012 | Pagaila et al. | |
| 8,188,584 B1 | 5/2012 | Berry et al. | |
| 8,193,647 B2 | 6/2012 | Hsieh et al. | |
| 8,258,633 B2 | 9/2012 | Sezi et al. | |
| 8,343,809 B2 * | 1/2013 | Lin et al. | 438/121 |
| 8,786,100 B2 * | 7/2014 | Lin et al. | 257/774 |
| 2003/0141105 A1 | 7/2003 | Sugaya et al. | |
| 2004/0056344 A1 | 3/2004 | Ogawa et al. | |
| 2004/0110316 A1 | 6/2004 | Ogihara et al. | |
| 2005/0073029 A1 | 4/2005 | Chua et al. | |
| 2005/0121771 A1 | 6/2005 | Lin et al. | |
| 2006/0046347 A1 | 3/2006 | Wood et al. | |
| 2006/0063312 A1 | 3/2006 | Kurita | |
| 2006/0084240 A1 | 4/2006 | Poo et al. | |
| 2007/0040258 A1 | 2/2007 | Sheats | |
| 2007/0178622 A1 | 8/2007 | Liu et al. | |
| 2007/0249153 A1 | 10/2007 | Dong | |
| 2008/0006900 A1 | 1/2008 | Chan et al. | |
| 2008/0012144 A1 | 1/2008 | Meyer et al. | |
| 2008/0054426 A1 | 3/2008 | Ohno et al. | |
| 2008/0090335 A1 | 4/2008 | Morimoto et al. | |
| 2008/0188037 A1 | 8/2008 | Lin | |
| 2008/0217761 A1 | 9/2008 | Yang et al. | |
| 2008/0246126 A1 | 10/2008 | Bowles et al. | |
| 2008/0265383 A1 | 10/2008 | Brunnbauer et al. | |
| 2008/0313894 A1 | 12/2008 | Fillion et al. | |
| 2009/0014869 A1 * | 1/2009 | Vrtis | H01L 24/05 257/737 |
| 2009/0042366 A1 | 2/2009 | Grivna | |
| 2009/0140442 A1 | 6/2009 | Lin | |
| 2009/0146282 A1 | 6/2009 | Tay et al. | |
| 2009/0152715 A1 | 6/2009 | Shim et al. | |
| 2009/0309212 A1 | 12/2009 | Shim et al. | |
| 2010/0258937 A1 | 10/2010 | Shim et al. | |
| 2011/0095404 A1 | 4/2011 | Yamano et al. | |
| 2011/0114950 A1 | 5/2011 | Huang | |
| 2011/0198762 A1 | 8/2011 | Scanlan | |
| 2011/0221055 A1 | 9/2011 | Lin et al. | |
| 2011/0221057 A1 | 9/2011 | Lin et al. | |
| 2011/0244657 A1 | 10/2011 | Grivna et al. | |
| 2011/0254156 A1 | 10/2011 | Lin | |
| 2011/0256690 A1 | 10/2011 | Huang | |

FOREIGN PATENT DOCUMENTS

| | | |
|---|---|---|
| CN | 101192550 A | 6/2008 |
| CN | 101261984 A | 9/2008 |
| CN | 101752273 A | 6/2010 |
| JP | 2007184636 A | 7/2007 |

* cited by examiner

SEMICONDUCTOR DEVICE AND METHOD OF FORMING REPASSIVATION LAYER WITH REDUCED OPENING TO CONTACT PAD OF SEMICONDUCTOR DIE

CLAIM TO DOMESTIC PRIORITY

The present application is a continuation of U.S. patent application Ser. No. 13/664,626, now U.S. Pat. No. 8,786, 100, filed Oct. 31, 2012, which is a division of U.S. patent application Ser. No. 12/724,367, now U.S. Pat. No. 8,343, 809, filed Mar. 15, 2010, which applications are incorporated herein by reference.

FIELD OF THE INVENTION

The present invention relates in general to semiconductor devices and, more particularly, to a semiconductor device and method of forming a repassivation layer over the semiconductor die with a reduced opening to the contact pad for better RDL alignment tolerance.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In most semiconductor devices, the semiconductor die are prone to shifting during encapsulation. The shift in position of the semiconductor die can cause the contact pad alignment to shift as much as ±20 µm, particularly in fan-out wafer level chip scale packages (FO-WLCSP). The die shift limits the minimum achievable pitch due to potential misalignment between the contact pad and subsequent RDL. For example, a 50×50 µm opening over 60 µm contact pad with 20 µm via has only ±15 µm alignment tolerance, which is less than the potential die shift of ±20 µm. As a result, the FO-WLCSP often require metal deposition and patterning, which adds manufacturing cost. In addition, some semiconductor manufacturing equipment requires special alignment marks to achieve the necessary tolerances.

SUMMARY OF THE INVENTION

A need exists to improve alignment between contact pads and RDL to achieve reduced pitch requirement. Accordingly, in one embodiment, the present invention is a method of making a semiconductor device comprising the steps of providing a semiconductor die including a first conductive layer, forming a first insulating layer over the semiconductor die and first conductive layer, forming a second insulating layer over the first insulating layer, and forming a via in the second insulating layer over the first conductive layer.

In another embodiment, the present invention is a method of making a semiconductor device comprising the steps of providing a semiconductor die, forming a first insulating layer over the semiconductor die, forming a second insulating layer over the first insulating layer, and forming a via in the second insulating layer.

In another embodiment, the present invention is a method of making a semiconductor device comprising the steps of providing a substrate including a first conductive layer, forming a first insulating layer over the first conductive layer, and forming a via in the first insulating layer over the first conductive layer.

In another embodiment, the present invention is a semiconductor device comprising a first conductive layer. A first insulating layer is formed over the first conductive layer. A via is formed in the first insulating layer over the first conductive layer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
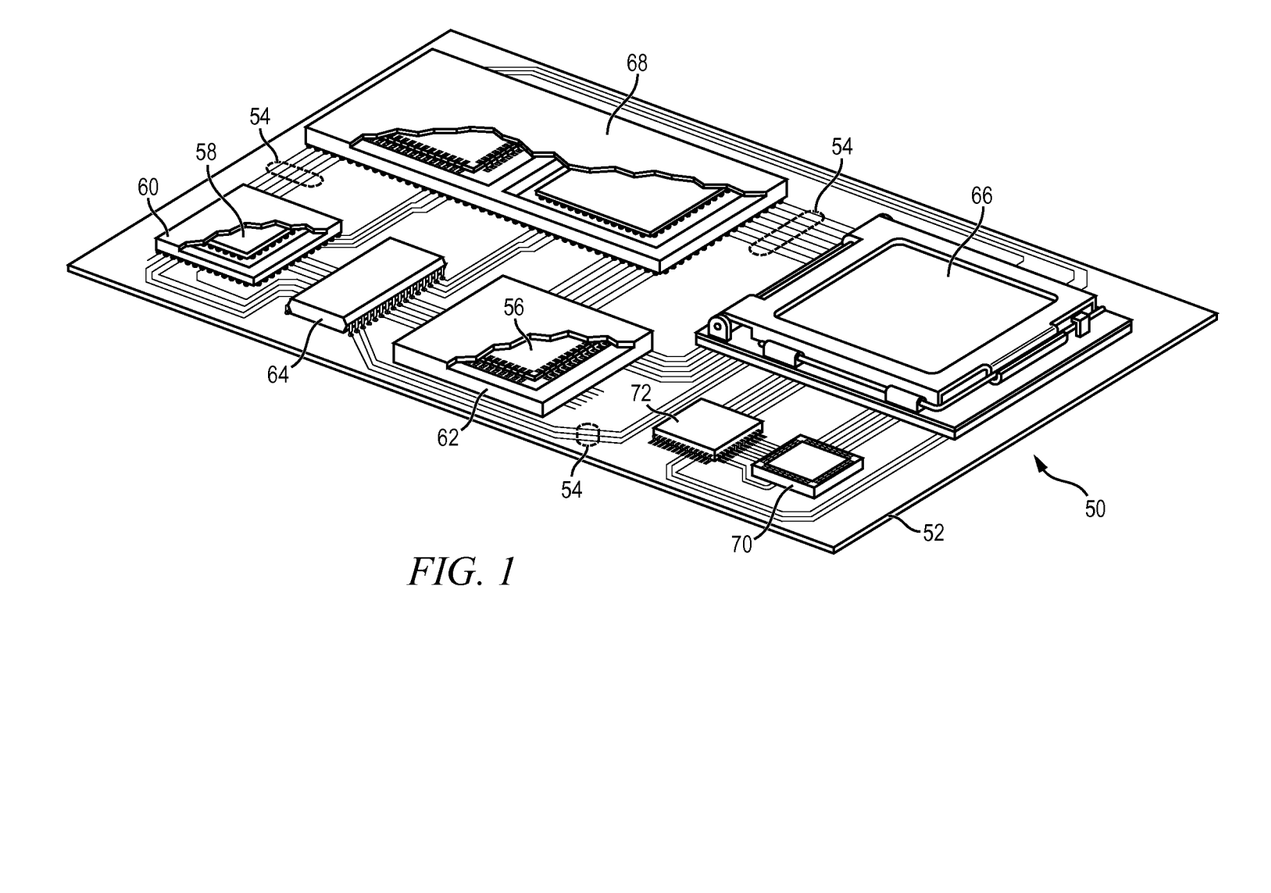
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
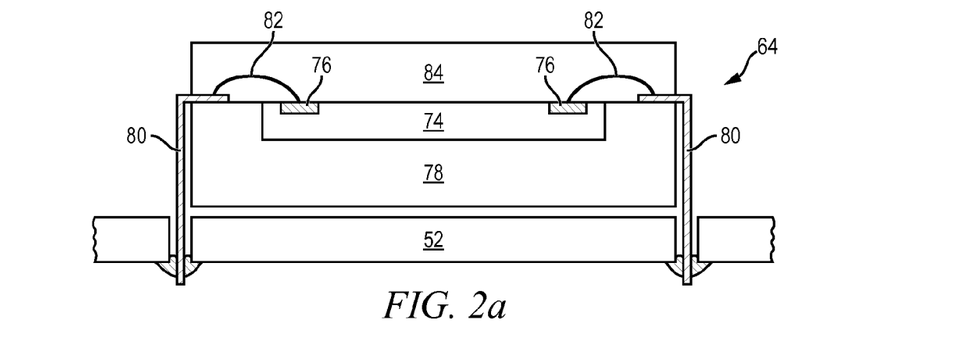
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 2B:
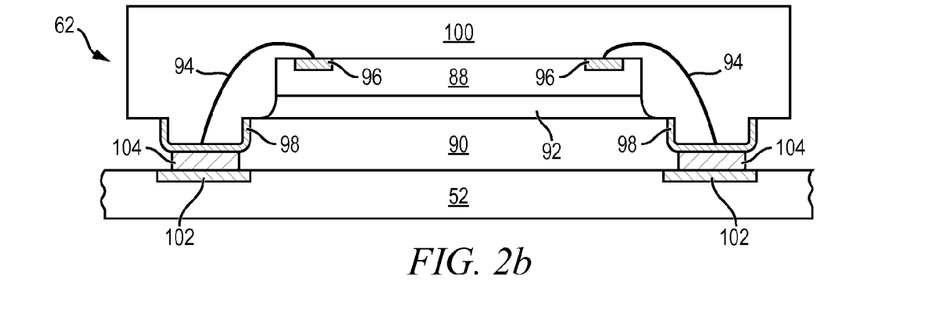

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
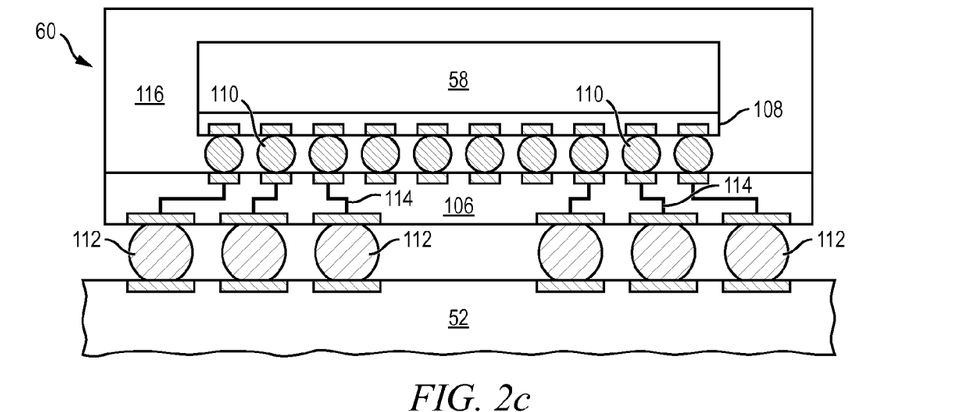

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
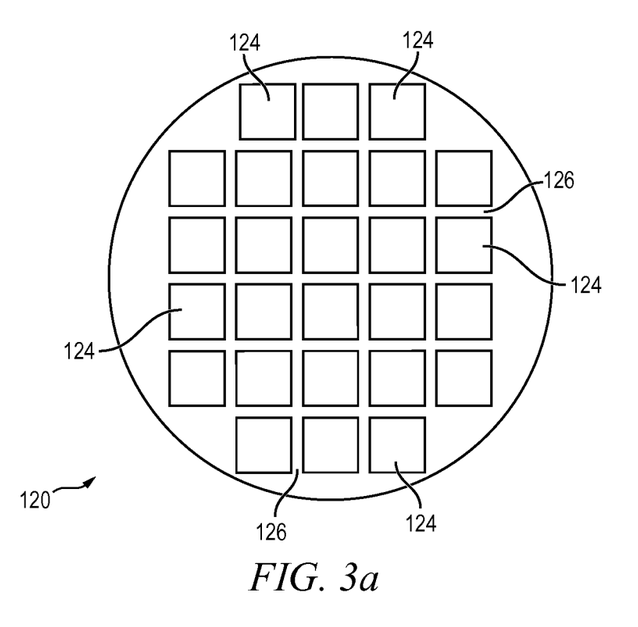
FIGS. 3a-3o illustrate a process of forming a repassivation layer over the semiconductor die with a reduced opening to the contact pad.

FIGS. 3a-3o illustrate, in relation to FIGS. 1 and 2a-2c, a process of forming a repassivation layer over the semiconductor die with a reduced opening to the contact pad for better RDL alignment tolerance. FIG. 3a shows a semiconductor wafer 120 with a base substrate material, such as silicon, germanium, gallium arsenide, indium phosphide, or silicon carbide, for structural support. A plurality of semiconductor die or components 124 is formed on wafer 120 separated by saw streets 126 as described above.

Figure 3B:
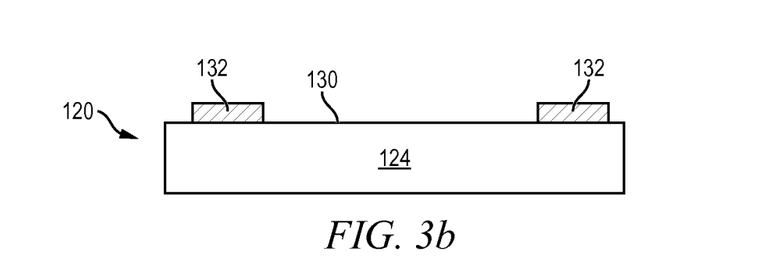

FIG. 3b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
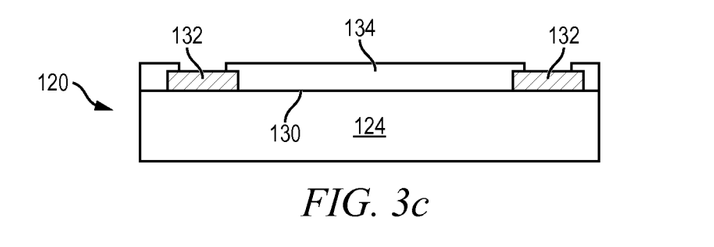

In FIG. 3c, an insulating or dielectric layer 134 is formed over active surface 130 and contact pads 132 using PVD, CVD, printing, spin coating, spray coating, or thermal oxidation. The insulating layer 134 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. A portion of insulating layer 134 is removed by an etching process to form an opening and expose contact pads 132.

Figure 3D:
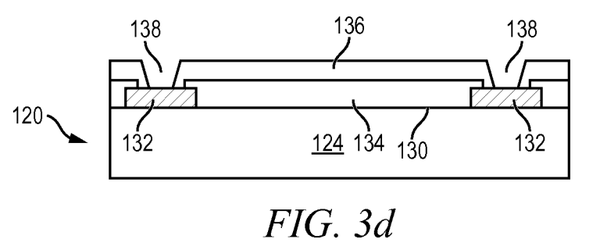

In FIG. 3d, a repassivation insulating layer 136 is formed over insulating layer 134 and contact pads 132 by PVD, CVD, printing, spin coating, spray coating, or thermal oxidation. The repassivation insulating layer 136 can be one or more layers of SiO2, Si3N4, SiON, Ta2O5, Al2O3, polyimide, PBO, polymer dielectric, or other material having similar insulating and structural properties. A portion of repassivation insulating layer 136 is removed by an etching process to form via 138 and expose an inside portion of contact pads 132, i.e. a portion of the contact pad within its footprint. Via 138 is formed within the opening of insulation layer 134. Via 138 is at least 10 micrometers smaller than the opening of insulation layer 134.

Figure 3E:
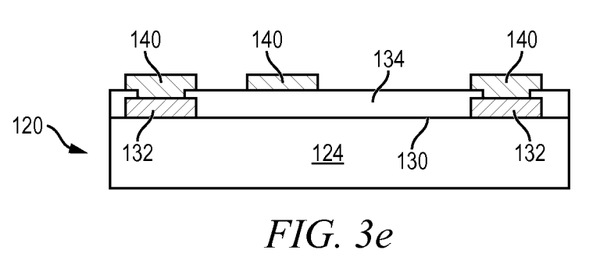

In another embodiment, continuing from FIG. 3c, an electrically conductive layer 140 is formed over insulating layer 134 and conductive layer 132 using PVD, CVD, electrolytic plating, electroless plating process, or other suitable metal deposition process, as shown in FIG. 3e. Conductive layer 140 can be one or more layers of Al, Cu, Sn, Ni, Au, Ag, or other suitable electrically conductive material.

Figure 3F:
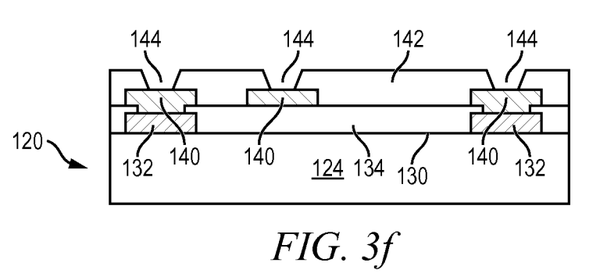

In FIG. 3f, a repassivation insulating layer 142 is formed over insulating layer 134 and conductive layer 140 by PVD, CVD, printing, spin coating, spray coating, or thermal oxidation. The repassivation insulating layer 142 can be one or more layers of SiO2, Si3N4, SiON, Ta2O5, Al2O3, polyimide, PBO, polymer dielectric, or other material having similar insulating and structural properties. A portion of repassivation insulating layer 142 is removed by an etching process to form via 144 and expose an inside portion of conductive layer 140, i.e. a portion of the conductive layer within its footprint. Via 144 is formed within the opening of insulation layer 134. Via 144 is at least 10 micrometers smaller than the opening of insulation layer 134.

Figure 3G:
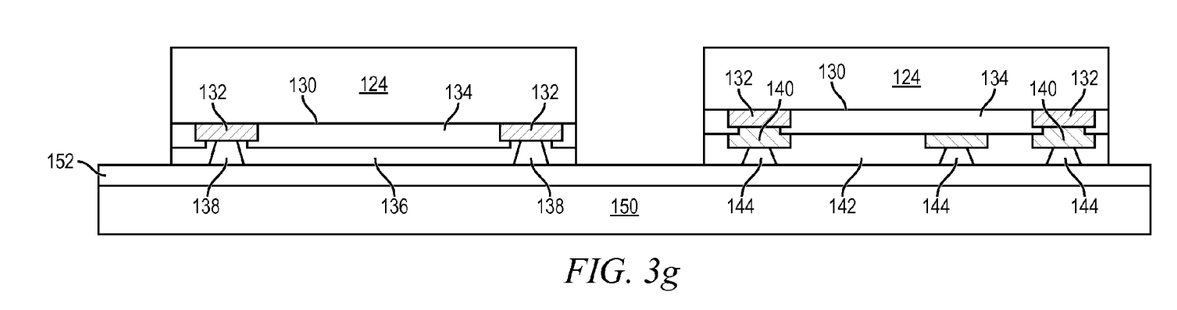

In FIG. 3g, a temporary substrate or carrier 150 contains temporary or sacrificial base material such as silicon, polymer, polymer composite, metal, ceramic, glass, glass epoxy, beryllium oxide, or other suitable low-cost, rigid material for structural support. An interface layer or tape 152 is applied over carrier 150 as a temporary adhesive bonding film or etch-stop layer. Semiconductor wafer 120 is singulated through saw streets 126 using a laser cutting tool or saw blade. Semiconductor die 124 are mounted to interface layer 152 over carrier 150 using pick and place operation. For the purpose of illustration, a semiconductor die 124 with repassivation insulating layer 136 from FIG. 3d, and semiconductor die 124 with conductive layer 140 and repassivation insulating layer 142 from FIG. 3f, are mounted to carrier 150 with vias 138 and 144 oriented to interface layer 152.

Figure 3H:
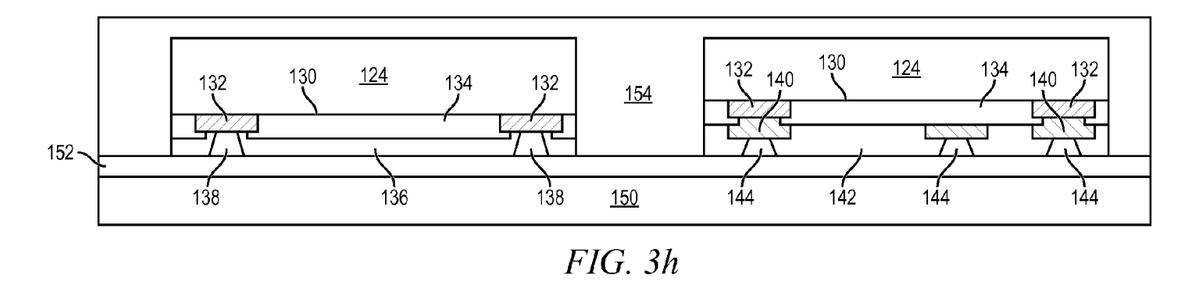

In FIG. 3h, an encapsulant or molding compound 154 is deposited over semiconductor die 124 and carrier 150 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is then thermal cured to a solid form. Encapsulant 154 is non-conductive and environmentally protects the semiconductor device from external elements and contaminants.

Figure 3I:
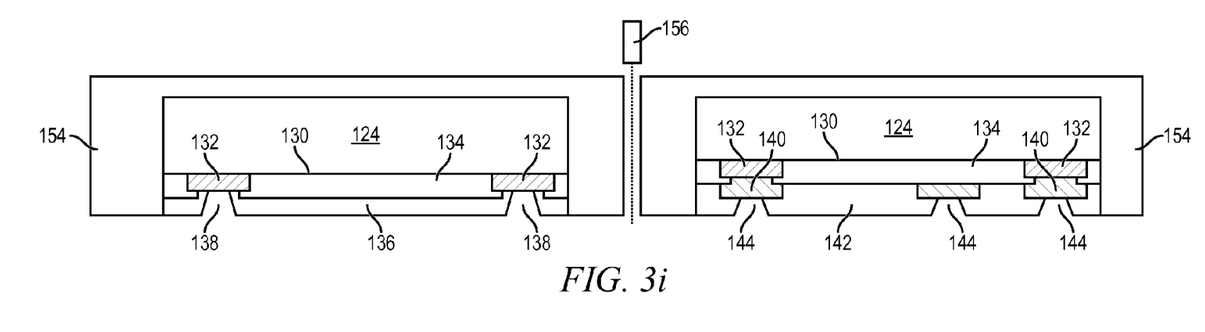

In FIG. 3i, the temporary carrier 150 and interface layer 152 are removed by chemical etching, mechanical peel-off, CMP, mechanical grinding, thermal bake, UV light, laser scanning, or wet stripping. Semiconductor die 124 are singulated using a laser cutting tool or saw blade 156.

Figure 3J:
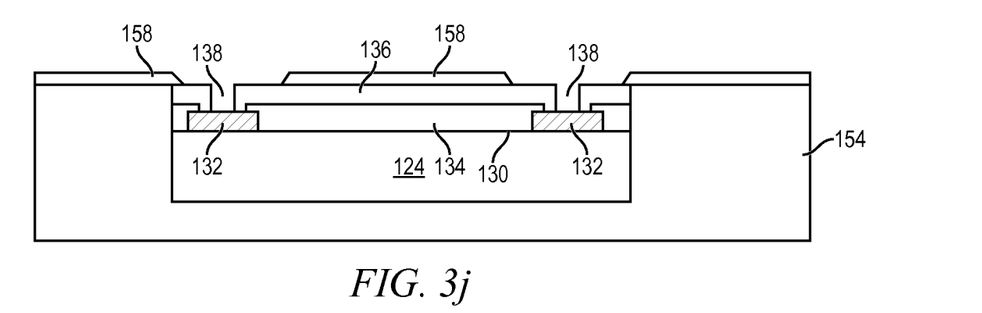

In FIG. 3j, an insulating or dielectric layer 158 is formed over repassivation insulating layer 136 and encapsulant 154 of the singulated semiconductor die 124 by PVD, CVD, screen printing, spin coating, spray coating, lamination, or thermal oxidation. The insulating layer 158 can be one or more layers of SiO2, Si3N4, SiON, Ta2O5, Al2O3, or other material having similar dielectric properties. A portion of insulating layer 158 is removed by an etching process to expose repassivation insulating layer 136 and contact pads 132. The opening of insulating layer 158 can be round vias, trenches, or rings, but in any case the opening is larger than vias 138 for alignment purposes. In one embodiment, the opening of insulating layer 158 extends at least 25 μm in each direction beyond vias 138.

Figure 3K:
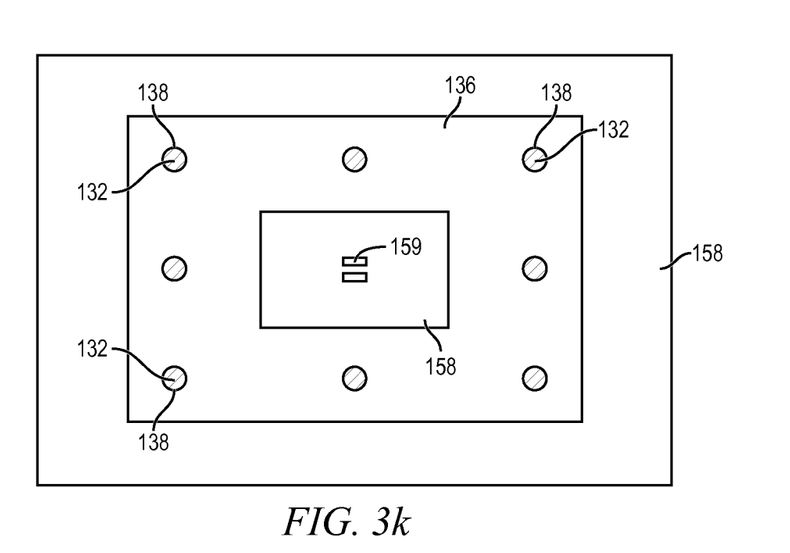

FIG. 3k shows a bottom view of insulating layers 158 and repassivation insulating layer 136 over semiconductor die 124 and encapsulant 154. Vias 138 are formed inside the footprint of contact pads 132 and extend down to the contact pads. An optional alignment mark 159 can be used for various manufacturing equipment.

Figure 3L:
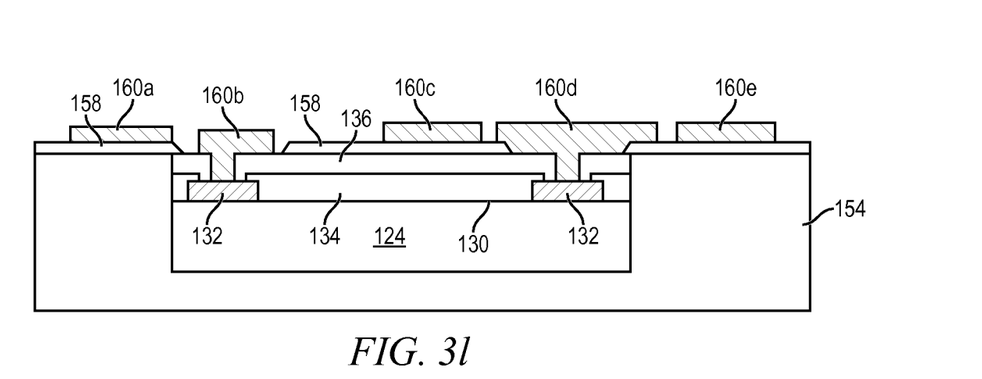

In FIG. 3l, an electrically conductive layer 160 is formed over repassivation insulating layer 136 and insulating layer 158 and into vias 138 to contact pads 132 using PVD, CVD, electrolytic plating, electroless plating process, or other suitable metal deposition process to form individual portions or sections 160a-160e. Conductive layer 160 can be one or more layers of Al, Cu, Sn, Ni, Au, Ag, or other suitable electrically conductive material. The individual portions of conductive layer 160a-160e can be electrically common or electrically isolated depending on the connectivity of the individual semiconductor die. Conductive layer 160b and 160d is electrically connected to contact pads 132 and operates as a redistribution layer (RDL) to extend the connectivity of the contact pads. Conductive layer 160 can be formed inside the opening in insulating layer 158 (see conductive layer 160b) or outside the opening in insulating layer 158 (see conductive layer 160d).

Figure 3M:
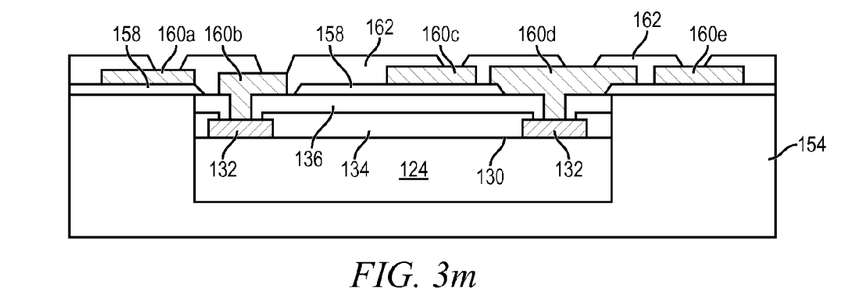

In FIG. 3m, an insulating or dielectric layer 162 is formed over insulating layer 158 and RDL 160 by PVD, CVD, screen printing, spin coating, spray coating, lamination, or thermal oxidation. The insulating layer 162 can be one or more layers of SiO2, Si3N4, SiON, Ta2O5, Al2O3, or other material having similar dielectric properties. A portion of insulating layer 162 is removed by an etching process to expose RDL 160.

Figure 3N:
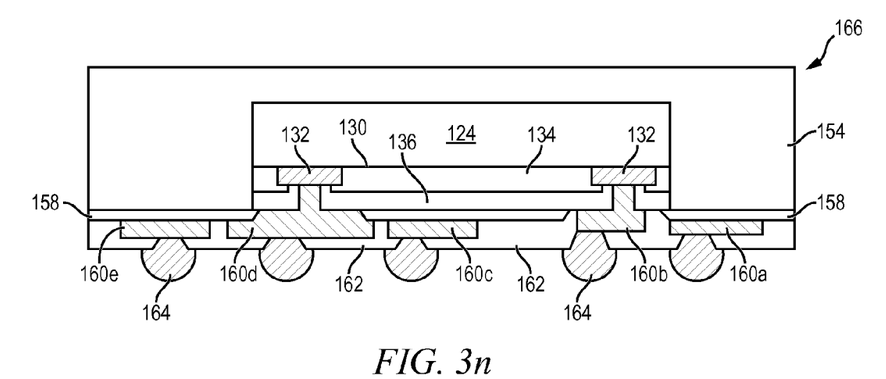

In FIG. 3n, an electrically conductive bump material is deposited over RDL 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 160 using a suitable attachment or bonding process. In one embodiment, the bump material is reflowed by heating the material above its melting point to form spherical balls or bumps 164. In some applications, bumps 164 are reflowed a second time to improve electrical contact to RDL 160. The bumps can also be compression bonded to RDL 160. Bumps 164 represent one type of interconnect structure that can be formed over RDL 160. The interconnect structure can also use bond wires, stud bump, micro bump, or other electrical interconnect.

Figure 3O:
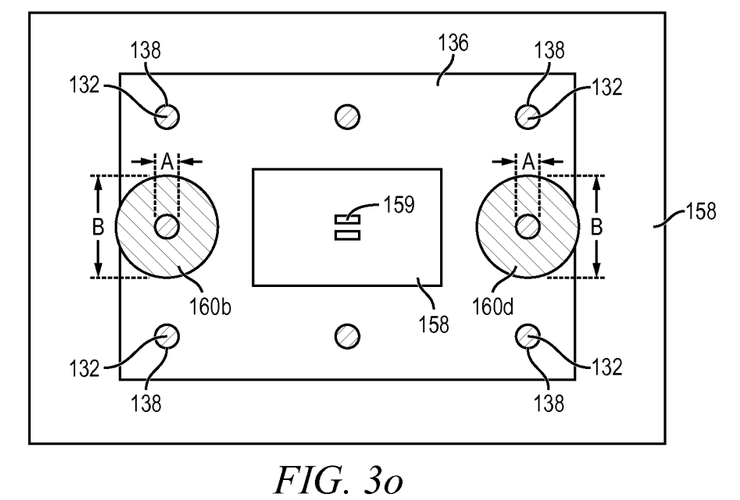

In FO-WLCSP 166 of FIG. 3n, semiconductor die 124 is electrically connected through contact pads 132, RDL 160, and bumps 164 to external electrical components. The repassivation insulating layer 136 in FIG. 3d and repassivation insulating layer 142 in FIG. 3f can be polymer dielectric material, such as polyimide, PBO, BCB, or repassivation inorganic dielectric, such as Si3N4, SiON, and SiO2. Vias 138 and 144 are formed through repassivation insulating layer 136 and repassivation insulating layer 142, respectively, inside the footprint of contact pads 132. FO-WLCSP 166 uses vias 138 and 144 in repassivation insulating layers 136 and 142 to reduce the opening to contact pads 132 which improves alignment tolerance with RDL 160. In one embodiment, vias 138 and 144 are 20 µm in width or diameter, and at least 10 micrometers smaller than the opening of insulation layer 134, shown as dimension A in FIG. 3o. RDL 160d has a width or diameter of 60 µm, shown as dimension B in FIG. 3o. The RDL alignment tolerance is thus ±20 µm with the 20 µm via 138 and 60 µm contact area for RDL 160b and 160d, which is within a typical die shift tolerance. In general, RDL 160 has at least 12 micrometer per side alignment tolerance with vias 138 and 144. The re-passivation insulating layers 136 and 142 improve yield for FO-WLCSP with lower cost since only lithography and thermal curing are needed. The re-passivation insulating layers 136 and 142 also planarize the surface of semiconductor die 124 for better adhesion to carrier 150 which reduces the potential shifting of semiconductor die 124. The insulating layer 136 has equal or better resolution as insulating layer 158. The repassivation insulating layers 136 and 142 can extend to saw street 126 to suppress cutting irregularities along the saw street, such as metal peeling, during wafer singulation. A double saw cut can be used instead of high cost laser cutting.

Figure 4:
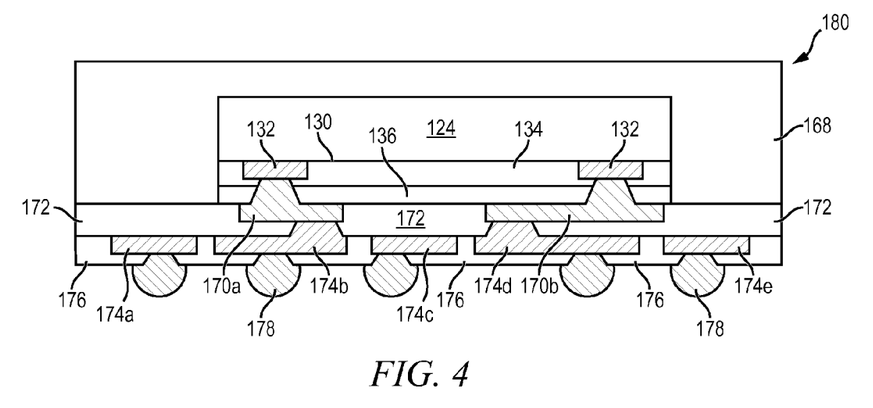
FIG. 4 illustrates another process of forming a repassivation layer over the semiconductor die to reduce an opening to the contact pad.

In another embodiment, continuing from FIG. 3i, an electrically conductive layer 170 is formed over repassivation insulating layer 136 and into vias 138 to contact pads 132 using PVD, CVD, electrolytic plating, electroless plating process, or other suitable metal deposition process to form individual portions or sections 170a-170b, see FIG. 4. Conductive layer 170 can be one or more layers of Al, Cu, Sn, Ni, Au, Ag, or other suitable electrically conductive material. The individual portions of conductive layer 170a and 170b can be electrically common or electrically isolated depending on the connectivity of the individual semiconductor die. Conductive layer 170a and 170b is electrically connected to contact pads 132 and operates as an RDL to extend the connectivity of the contact pads.

An insulating or dielectric layer 172 is formed over repassivation insulating layer 136 and RDL 170 by PVD, CVD, screen printing, spin coating, spray coating, lamination, or thermal oxidation. The insulating layer 172 can be one or more layers of SiO2, Si3N4, SiON, Ta2O5, Al2O3, or other material having similar dielectric properties. A portion of insulating layer 172 is removed by an etching process to expose RDL 170.

An electrically conductive layer 174 is formed over insulating layer 172 and RDL 170 using PVD, CVD, electrolytic plating, electroless plating process, or other suitable metal deposition process to form individual portions or sections 174a-174e. Conductive layer 174 can be one or more layers of Al, Cu, Sn, Ni, Au, Ag, or other suitable electrically conductive material. The individual portions of conductive layer 174a-174e can be electrically common or electrically isolated depending on the connectivity of the individual semiconductor die. Conductive layer 174b and 174d are electrically connected to RDL 170a and 170b, respectively, and operates as an RDL to extend the connectivity.

An insulating or dielectric layer 176 is formed over insulating layer 172 and RDL 174 by PVD, CVD, screen printing, spin coating, spray coating, lamination, or thermal oxidation. The insulating layer 176 can be one or more layers of SiO2, Si3N4, SiON, Ta2O5, Al2O3, or other material having similar dielectric properties. A portion of insulating layer 176 is removed by an etching process to expose RDL 174.

An electrically conductive bump material is deposited over RDL 174 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 174 using a suitable attachment or bonding process. In one embodiment, the bump material is reflowed by heating the material above its melting point to form spherical balls or bumps 178. In some applications, bumps 178 are reflowed a second time to improve electrical contact to RDL 174. The bumps can also be compression bonded to RDL 174. Bumps 178 represent one type of interconnect structure that can be formed over RDL 174. The interconnect structure can also use bond wires, stud bump, micro bump, or other electrical interconnect.

In FO-WLCSP 180 of FIG. 4, semiconductor die 124 is electrically connected through contact pads 132, RDLs 170 and 174, and bumps 178 to external electrical components. The repassivation insulating layer 136 can be polymer dielectric material, such as polyimide, PBO, BCB, or repassivation inorganic dielectric, such as Si3N4, SiON, and SiO2. Vias 138 are formed through repassivation insulating layer 136 inside the footprint of contact pads 132. FO-WLCSP 180 uses vias 138 in repassivation insulating layer 136 to reduce the opening to contact pads 132 which improves alignment tolerance with RDL 170. In one embodiment, vias 138 are 20 µm in width or diameter, and at least 10 micrometers smaller than the opening of insulation layer 134. RDL 170a and 170b has a width or diameter of 60 µm. The RDL alignment tolerance is thus ±20 µm with the 20 µm via 138 and 60 µm contact area for RDL 170a and 170b, which is within a typical die shift tolerance. In general, RDL 170 has at least 12 micrometer per side alignment tolerance with vias 138. The re-passivation insulating layers 136 improve yield for FO-WLCSP with lower cost since only lithography and thermal curing are needed. The re-passivation insulating layers 136 also planarize the surface of semiconductor die 124 for better adhesion to the temporary carrier which reduces the potential shifting of semiconductor die 124. The repassivation insulating layers 136 can extend to saw street 126 to suppress cutting irregularities along the saw street, such as metal peeling, during wafer singulation. A double saw cut can be used instead of high cost laser cutting.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die including a first conductive layer;
    forming a first insulating layer over the semiconductor die and first conductive layer;

forming an opening in the first insulating layer over the first conductive layer;

forming a second insulating layer over the first insulating layer; and forming a via in the second insulating layer over the first conductive layer, wherein a width of the via is less than a width of the opening in the first insulating layer.

2. The method of claim 1, further including forming a second conductive layer over the first conductive layer.

3. The method of claim 1, further including:

forming a third insulating layer over the second insulating layer; and forming a second conductive layer over the third insulating layer.

4. The method of claim 3, further including forming an opening in the third insulating layer and including a width greater than a width of the via.

5. A method of making a semiconductor device, comprising:

providing a semiconductor die;

forming a first insulating layer over the semiconductor die;

forming a second insulating layer over the first insulating layer and within an opening in the first insulating layer; and forming a via in the second insulating layer.

6. The method of claim 5, further including forming the via over a contact pad of the semiconductor die.

7. The method of claim 5, further including:

forming a first conductive layer over the semiconductor die; and forming a second conductive layer over the first conductive layer.

8. The method of claim 5, further including disposing a conductive layer in the via.

9. The method of claim 5, further including:

forming a third insulating layer over the second insulating layer; and forming a conductive layer over the third insulating layer.

10. The method of claim 5, further including:

depositing an encapsulant over the semiconductor die; and forming a conductive layer within the via and over the encapsulant.

11. A method of making a semiconductor device, comprising:

providing a substrate including a first conductive layer;

forming a first insulating layer over the substrate;

forming a second insulating layer over the first conductive layer and within an opening in the first insulating layer; and forming a via in the second insulating layer over the first conductive layer.

12. The method of claim 11, further including disposing a second conductive layer within the via.

13. The method of claim 11, further including forming a second conductive layer over the first conductive layer.

14. The method of claim 11, further including:

forming a third insulating layer over the second insulating layer;

forming an opening in the third insulating layer over the via; and forming a second conductive layer over the third insulating layer.

15. The method of claim 11, wherein a width of the via is less than a width of the first conductive layer.

16. The method of claim 11, wherein the substrate includes a semiconductor die.

17. The method of claim 11, wherein a width of the via is less than a width of the opening in the first insulating layer.

18. The method of claim 1, further including forming a second conductive layer over the via, wherein a width of the second conductive layer is greater than a width of the via.

19. The method of claim 1, further including forming an interconnect structure over the via.

20. The method of claim 5, wherein a width of the via is less than a width of the opening in the first insulating layer.

21. A method of making a semiconductor device, comprising:

forming a first conductive layer;

forming a first insulating layer over the first conductive layer;

forming a second insulating layer over the first conductive layer and first insulating layer;

forming a via in the second insulating layer over the first conductive layer; and forming a second conductive layer over the second insulating layer and within the via.

22. The method of claim 21, wherein forming the first conductive layer includes forming the first conductive layer over a semiconductor die as a contact pad of the semiconductor die.

23. The method of claim 21, further including forming an opening in the first insulating layer, wherein the width of the via is less than a width of the opening in the first insulating layer.

24. The method of claim 21, further including:

forming a third insulating layer over the second insulating layer; and forming an opening in the third insulating layer over the via.

25. The method of claim 24, wherein a width of the opening in the third insulating layer is greater than a width of the via.

* * * * *